United States Patent
Kang

(10) Patent No.: US 8,987,717 B2
(45) Date of Patent: Mar. 24, 2015

(54) ORGANIC LIGHT EMITTING DIODE DISPLAY AND METHOD OF FABRICATING THE SAME

(71) Applicant: Samsung Display Co., Ltd., Yongin-si, Gyeonggi-do (KR)

(72) Inventor: Jin Goo Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 13/742,285

(22) Filed: Jan. 15, 2013

(65) Prior Publication Data

US 2014/0070175 A1    Mar. 13, 2014

(30) Foreign Application Priority Data

Sep. 10, 2012 (KR) .......... 10-2012-0099777

(51) Int. Cl.
| H01L 51/52 | (2006.01) |
| H01L 51/56 | (2006.01) |
| H01L 27/32 | (2006.01) |

(52) U.S. Cl.
CPC .............. *H01L 51/52* (2013.01); *H01L 51/56* (2013.01); *H01L 27/3246* (2013.01)
USPC ............. 257/40; 257/E51.018; 257/E21.459; 438/34; 438/99

(58) Field of Classification Search
None
See application file for complete search history.

(56) References Cited

U.S. PATENT DOCUMENTS

| 7,294,856 | B2 * | 11/2007 | Ito et al. ............................. 257/72 |
| 2005/0058840 | A1 * | 3/2005 | Toyoda .......................... 428/428 |
| 2006/0270082 | A1 * | 11/2006 | Moriya et al. ................... 438/29 |
| 2008/0286487 | A1 * | 11/2008 | Lang et al. ..................... 427/532 |
| 2009/0155723 | A1 |  6/2009 | Lang et al. |
| 2010/0124603 | A1 * |  5/2010 | Ito et al. ........................... 427/66 |
| 2011/0198624 | A1 * |  8/2011 | Matsushima ................... 257/88 |
| 2012/0012834 | A1 * |  1/2012 | Sonoda et al. ................... 257/40 |
| 2012/0319089 | A1 * | 12/2012 | Shin et al. ........................ 257/40 |
| 2013/0099659 | A1 * |  4/2013 | Park .............................. 313/504 |

FOREIGN PATENT DOCUMENTS

| KR | 10-2010-0054351 A | 5/2010 |
| KR | 10-2011-0081522 A | 7/2011 |
| KR | 10-1058109 A | 8/2011 |

OTHER PUBLICATIONS

Wei, Mao-Kuo, Chii-Wann Lin, Chih-Chung Yang, Yean-Woei Kiang, Jiun-Haw Lee, and Hoang-Yan Lin. "Emission Characteristics of Organic Light-Emitting Diodes and Organic Thin-Films with Planar and Corrugated Structures." International Journal of Molecular Sciences 11.4 (2010): 1527-545.*

Jin, Hongzheng. Novel Patterning Methods for Full-Color Polymer Light-Emitting Displays. Diss. Princeton U, 2010. Princeton: Department of Electrical Engineering, 2010.*

Korean Patent Abstracts No. 102010029311 A, for Publication No. KR 10-1058109 A (1 page).

* cited by examiner

*Primary Examiner* — Joseph Schoenholtz
(74) *Attorney, Agent, or Firm* — Christie, Parker & Hale, LLP

(57) ABSTRACT

An organic light emitting diode (OLED) display is provided. The OLED display includes: a substrate; a first electrode on the substrate; a first pixel defining layer exposing at least a portion of the first electrode; a medium layer on the first pixel defining layer and the first electrode, the medium layer including a first region and a second region; a second pixel defining layer overlapping the first pixel defining layer with the first region therebetween; a light emission layer overlapping the first electrode with the first region therebetween; and a second electrode covering the second pixel defining layer and the light emission layer.

22 Claims, 6 Drawing Sheets

ORGANIC LIGHT EMITTING DIODE DISPLAY AND METHOD OF FABRICATING THE SAME

CROSS-REFERENCE TO RELATED APPLICATION

This application claims priority to and the benefit of Korean Patent Application No. 10-2012-0099777, filed on Sep. 10, 2012 in the Korean Intellectual Property Office, the entire content of which is incorporated herein by reference.

BACKGROUND

1. Field

Aspects of embodiments of the present invention relate to an organic light emitting diode (OLED) display and a method of fabricating the same.

2. Description of the Related Art

An OLED display is a self-emissive display device that displays images by exciting an emissive organic material to emit light. The OLED display includes an anode (i.e., a hole injection electrode), a cathode (i.e., an electron injection electrode), and an organic light emission layer interposed therebetween. When the holes and the electrons are injected into the light emission layer, they recombine to form excitons, which emit light when they change from an excited state to a ground state.

The organic light emission layer is disposed at each pixel of the OLED display. The organic light emission layer in each pixel is spatially separated by a pixel defining layer. The pixel defining layer may be formed to have a larger thickness than the organic light emission layer. A surface of the pixel defining layer may protrude more than a surface of the organic light emission layer.

The thickness of the pixel defining layer is associated with pixel protection. For example, when an encapsulating substrate is pressed toward pixels in a structure having the encapsulating substrate provided on the organic light emission layer, if the thickness of the pixel defining layer is too small, the pixels may be pressed (for example directly pressed), causing dark spots. In addition, if the thickness of the pixel defining layer is small, it may cause unwanted capacitance between lines under the pixel defining layer and electrodes over the pixel defining layer.

SUMMARY

Aspects of embodiments of the present invention relate to an OLED display and a method of fabricating the OLED display. Further aspects relate to an OLED display including a pixel defining layer and an organic light emission layer, and a method of fabricating the OLED display. Embodiments of the present invention provide for an OLED display that can reduce or prevent dark spots from being caused to pixels due to pressing of a pixel defining layer by forming the pixel defining layer to have a sufficiently large thickness, and can reduce capacitance between lines over and under a pixel defining layer. Further embodiments of the present invention provide for a method of fabricating an OLED display having a pixel defining layer with a sufficiently large thickness. These and other aspects of the present invention will be described in or be apparent to one of ordinary skill in the art from the following description of exemplary embodiments.

In an exemplary embodiment according to the present invention, an organic light emitting diode (OLED) display is provided. The OLED display includes: a substrate; a first electrode on the substrate; a first pixel defining layer exposing at least a portion of the first electrode; a medium layer on the first pixel defining layer and the first electrode, the medium layer including a first region and a second region; a second pixel defining layer overlapping the first pixel defining layer with the first region therebetween; a light emission layer overlapping the first electrode with the first region therebetween; and a second electrode covering the second pixel defining layer and the light emission layer.

The second region may be formed by surface modification of the first region, or the first region may be formed by surface modification of the second region.

The second region may have lower wettability than the first region.

The second region may overlap the first pixel defining layer while not overlapping the second pixel defining layer.

The first pixel defining layer may have a first thickness of 1 μm or less. A sum of the first thickness and a thickness of the second pixel defining layer may be greater than 1 μm.

The medium layer may be a common layer for pixels of the OLED display.

According to another exemplary embodiment of the present invention, an organic light emitting diode (OLED) display is provided. The OLED display includes: a substrate supporting a plurality of pixels; a first electrode in each of the pixels; a medium layer on the substrate and the first electrode, the medium layer including a first region and a second region; a pixel defining layer on the first region and positioned at boundary portions of the pixels; a light emission layer on the first region and overlapping the first electrode; and a second electrode covering the pixel defining layer and the light emission layer.

The second region may be formed by surface modification of the first region, or the first region may be formed by surface modification of the second region.

The second region may have lower wettability than the first region.

The second region may not overlap the pixel defining layer.

The medium layer may be a common layer of the pixels.

According to yet another exemplary embodiment of the present invention, a method of fabricating an organic light emitting diode (OLED) display is provided. The method includes: forming a first electrode on a substrate; forming a first pixel defining layer on the substrate while exposing at least a portion of the first electrode; forming a medium layer on the first pixel defining layer and the first electrode, the medium layer including a first region and a second region; forming a second pixel defining layer overlapping the first pixel defining layer with the first region therebetween; forming a light emission layer overlapping the first electrode with the first region therebetween; and forming a second electrode covering the second pixel defining layer and the light emission layer.

The forming of the medium layer may include forming the second region by selective surface modification of the first region, or forming the first region by selective surface modification of the second region.

The selective surface modification may include selective UV radiation.

The forming of the second pixel defining layer may include nozzle printing or inkjet printing.

The first pixel defining layer may have a first thickness of 1 μm or less. A sum of the first thickness and a thickness of the second pixel defining layer may be greater than 1 μm.

According to still yet another exemplary embodiment of the present invention, a method of fabricating an organic light emitting diode (OWED) display is provided. The method includes: forming a first electrode on a substrate; forming a medium layer on the substrate and the first electrode, the medium layer including a first region and a second region; forming a pixel defining layer on the first region at boundary portions of the pixels; forming a light emission layer on the first region and overlapping the first electrode; and forming a second electrode covering the pixel defining layer and the light emission layer.

The forming of the medium layer may include forming the second region by selective surface modification of the first region, or forming the first region by selective surface modification of the second region.

The selective surface modification may include selective UV radiation.

The forming of the pixel defining layer may include nozzle printing or inkjet printing.

Embodiments of the present invention provide for an OLED display having a pixel defining layer that can be formed to have a sufficiently large thickness to protect the pixels and reduce unwanted capacitance while maintaining film uniformity of a first medium layer. Accordingly, the pixels are not pressed (for example, directly pressed) when an encapsulating substrate is pressed toward the pixels, thereby suppressing dark spots from being generated in the pixels. In addition, as the overall thickness of the pixel defining layer is increased, unwanted capacitance can be reduced or prevented from being generated between electrodes over and under the pixel defining layer.

BRIEF DESCRIPTION OF THE DRAWINGS

The above and other features and aspects of the present invention will become more apparent by describing in detail preferred embodiments thereof with reference to the attached drawings in which.

DETAILED DESCRIPTION

Aspects and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided to more fully convey concepts of the present invention to those skilled in the art. The scope of the present invention is defined by the appended claims, and their equivalents.

When an element or layer is referred to as being "on" another element or layer, it can be directly on the other element or layer, or intervening elements or layers may be present. Like numbers refer to like elements throughout. Although the terms first, second, third, etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the corresponding embodiment. Embodiments of the present invention will now be described with reference to the accompanying drawings.

Figure 1:
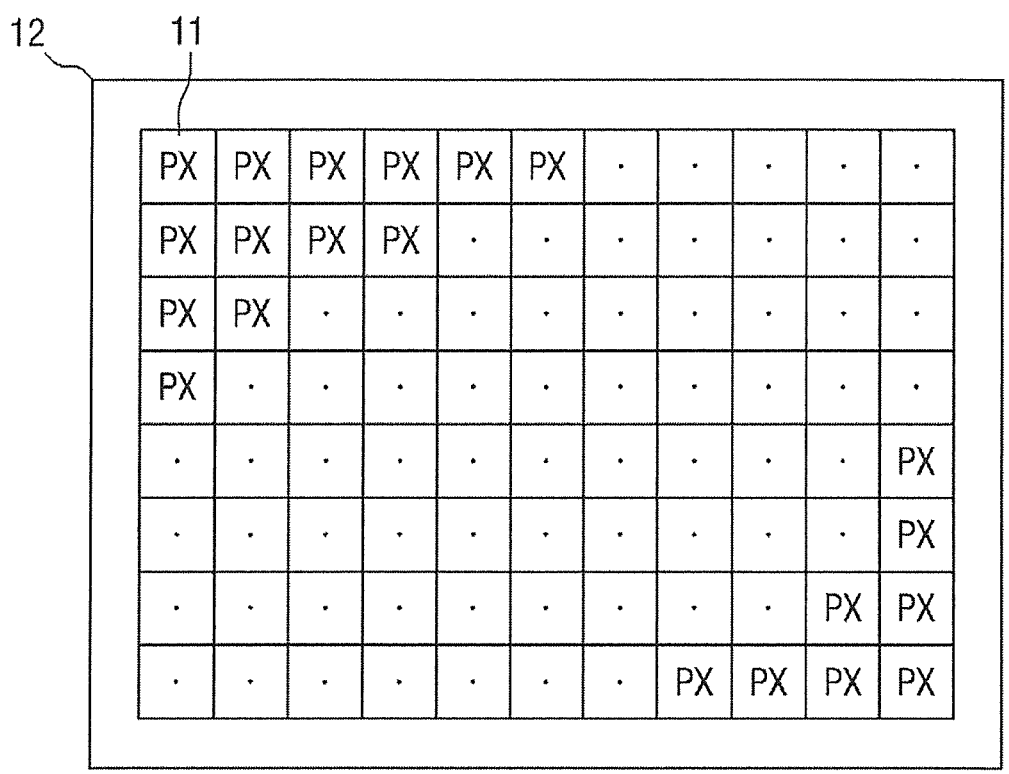
FIG. 1 is a schematic view of an OLED display according to embodiments of the present invention.

FIG. 1 is a schematic view of an OLED display 10 according to embodiments of the present invention. Referring to FIG. 1, the OLED display 10 includes a display region 11 and a non-display region 12. The display region 11 may be positioned, for example, at a central portion of the OLED display 10. The display region 11 includes a plurality of pixels PX. Each of the pixels PX emits light having a particular color wavelength. In an exemplary embodiment, the pixels PX include red, green, and blue pixels. The non-display region 12 may be positioned, for example, around the display region 11. The non-display region 12 may include a driver that supplies an electrical signal, such as a data signal or a scanning signal, to the display region 11.

Figure 2:
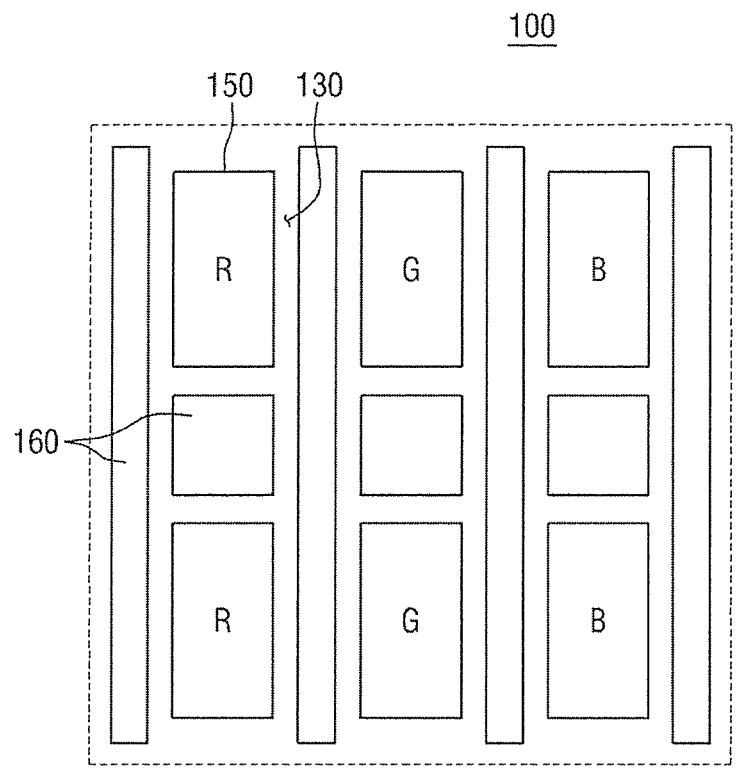
FIG. 2 is a layout view of an OLED display according to an embodiment of the present invention.

FIG. 2 is a layout view of an OLED display 100 according to an embodiment of the present invention. Referring to FIG. 2, each pixel includes a light emission layer 150. In an exemplary embodiment, the light emission layer 150 of each pixel emits light of any one of red (R), green (G), or blue (B) colors. The light emission layers 150 of different pixels are divided by a pixel defining layer. The pixel defining layer includes a first pixel defining layer 130 and a second pixel defining layer 160. As shown in FIG. 2, the first pixel defining layer 130 is adjacent to the light emission layer 150. The second pixel defining layer 160 may be spaced a set distance (such as a predetermined distance) apart from the light emission layer 150, but aspects of the present invention are not limited thereto. A configuration of a pixel PX of the display region 11 (see FIG. 1) as embodied in the OLED display 100 of FIG. 2 will now be described in more detail.

Figure 3:
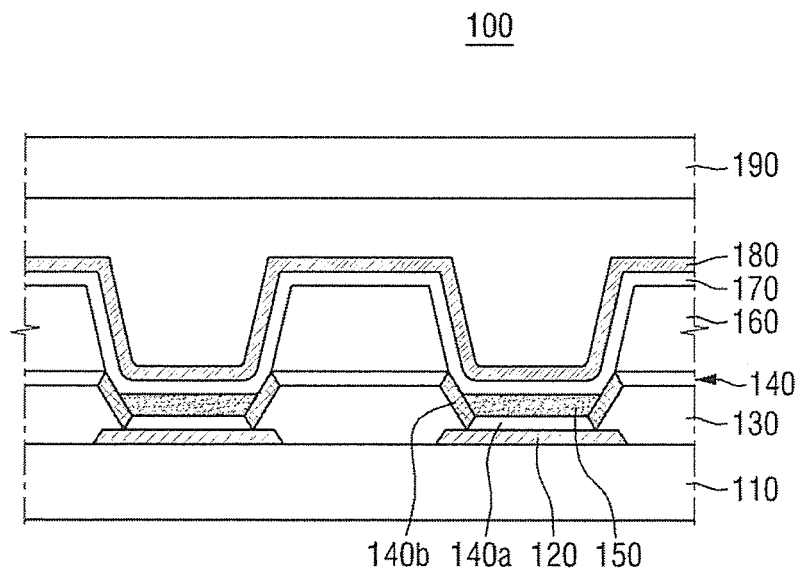
FIG. 3 is a cross-sectional view of the OLED display shown in FIG. 2.

FIG. 3 is a cross-sectional view of the OLED display 100 shown in FIG. 2.

Referring to FIGS. 2 and 3, a first electrode 120 for each pixel is formed on a substrate 110. The first electrodes 120 of different pixels are physically and electrically separated from each other. The substrate 110 may include, for example, an insulating substrate. The insulating substrate may be made, for example, of a transparent glass material having transparent $SiO_2$ as a main component. In some embodiments, the insulating substrate may be made of an opaque material or a plastic material. Further, the insulating substrate may be, for example, a flexible substrate. The substrate 110 may further include other structures formed on the insulating substrate. Examples of the other structures include wirings, electrodes, insulation films, or the like. When the OLED display 100 is an active OLED display, the substrate 110 may include a plurality of thin film transistors formed on an insulating substrate. Drain electrodes of some of the thin film transistors may be electrically connected to the first electrodes 120.

The first pixel defining layer 130 is formed on the substrate 110 and possibly portions of the first electrodes 120. The first pixel defining layer 130 is positioned on boundary portions of pixels to define the respective pixels. In addition, the first pixel defining layer 130 may define an opening where the light emission layer 150 is positioned. Some or all of the first electrode 120 is exposed by the opening of the first pixel defining layer 130. In the exemplary embodiment of FIG. 3, lateral portions of the first electrode 120 extend toward and are partially overlapped by the first pixel defining layer 130. That is, in an overlapping area of the first pixel defining layer 130 and the first electrode 120, the first pixel defining layer 130 is positioned above the first electrode 120 with respect to the substrate 110.

The first electrode 120 may be an anode or cathode electrode of the OLED display 100. When the first electrode 120 is an anode electrode, a second electrode 180 is a cathode electrode. For ease of description, the embodiment of FIG. 3 will be described with the first electrode 120 being an anode electrode. However, in other embodiments, the first electrode 120 may be a cathode electrode and the second electrode 180 may be an anode electrode. The first electrode 120 may be made, for example, of a conductive material having a high work function. When the OLED display 100 is a rear emission display, the first electrode 120 may be made, for example, of ITO, IZO, ZnO, or $In_2O_3$, or may be formed of stacked films of these materials. When the OLED display 100 is a front emission display, the first electrode 120 may further include a reflection film made of Ag, Mg, Al, Pt, Pd, Au, Ni, Nd, Ir, Cr, Li, or Ca.

The first pixel defining layer 130 may be made of an insulating material. For example, the first pixel defining layer 130 may include at least one organic material selected from the group consisting of benzocyclobutene (BCB), polyimide (PI), polyamaide (PA), acryl resin, and phenol resin. In other embodiments, the first pixel defining layer 130 may include an inorganic material, such as silicon nitride.

As shown in the exemplary embodiment of FIG. 3, the first medium layer 140 is formed on the first pixel defining layer 130 and the portion of the first electrode 120 exposed by the opening of the first pixel defining layer 130. The first medium layer 140 helps with injection or transport of electrons or holes between the first electrode 120 and the light emission layer 150. When the first electrode 120 is an anode electrode (as described in this embodiment), the first medium layer 140 is associated with hole injection or transport. For example, the first medium layer 140 may be formed as a single layer of a hole injection layer or a hole transport layer, or as a stacked layer of a hole injection layer and a hole transport layer. The hole injection layer may include, for example, a phthalocyanine compound, such as copper phthalocyanine, or a Starburst type amine, such as TCTA, m-MTDATA, or m-MTDAPB. The hole transport layer may include, for example, N,N'-bis (3-methylphenyl)-N,N'-diphenyl-[1,1-biphenyl]-4,4'-diamine (TPD), or N,N'-di(naphthalen-1-yl)-N,N'-diphenyl benzidine (α-NPD).

In other embodiments, the first medium layer 140 extends, for example, to a top surface of the first pixel defining layer 130. More generally, in other embodiments, the first medium layer 140 is separated by each pixel. However, as shown in the exemplary embodiment of FIG. 3, the first medium layer 140 is integrally formed over the entire surface of the OLED display 100. In such an embodiment, the first medium layer 140 is a common layer and not related with pixel distinction.

In embodiments where the first medium layer 140 is a common layer (such as FIG. 3), it may be desired for the first medium layer 140 to have a uniform thickness throughout the OLED display 100. However, the film thickness uniformity of the first medium layer 140 is related to the thickness of the first pixel defining layer 130, as measured by a distance from the bottom surface of the first pixel defining layer 130 to the top surface of the first pixel defining layer 130. If the first pixel defining layer 130 is too thick (for example, greater than 1 μm), it may be difficult to secure film thickness uniformity of the entire first medium layer 140. Therefore, the thickness of the first pixel defining layer 130 may be adjusted to 1 μm or less, but aspects of the present invention are not limited thereto.

In the exemplary embodiment of FIG. 3, the first medium layer 140 includes a first region 140a and a second region 140b. The first region 140a and the second region 140b differ from each other in terms of wettability (or wetting, that is, the ability to maintain contact with liquid). For example, the first region 140a may have relatively high wettability (for example, attracts or adheres to liquid) and the second region 140b may have relatively low wettability (for example, repels liquid). The first region 140a and the second region 140b may acquire this different wettability through selective surface treatment. For example, a material film having the same property as the first region 140a (that is, high wettability) is coated over the entire OLED display 100 and a portion of the material film is subjected to selective surface treatment to reduce the wettability, thereby forming the second region 140b. Examples of the selective surface treatment include UV radiation using an optical mask.

For example, in the exemplary embodiment of FIG. 3, the first region 140a is positioned on a top surface of the first electrode 120 and on a top surface of the first pixel defining layer 130, while the second region 140b is positioned on a lateral surface or a tilted surface of the first pixel defining layer 130. Thus, the first region 140a includes two portions, namely a first portion on the first electrode 120 (i.e., the first region 140a on the first electrode 120) and a second portion on the first pixel defining layer 130 (i.e., the first region 140a on the first pixel defining layer 130). In some embodiments, the second region 140b may partially extend more to the top surface of the first pixel defining layer 130. However, as will be described later, in order to secure a portion for forming the second pixel defining layer 160, the second region 140b may not extend to entirely cover the top surface of the first pixel defining layer 130.

The light emission layer 150 is positioned on the first medium layer 140. As shown in FIG. 3, the light emission layer 150 overlaps the first electrode 120 in the opening of the first pixel defining layer 130. In addition, because of the wettability differences in the first region 140a and the second region 140b, the light emission layer 150 directly contacts the first region 140a on the first electrode 120, but may not directly contact the second region 140b. Therefore, the first region 140a and the second region 140b may define the region where the light emission layer 150 is formed in the opening of the first pixel defining layer 130.

When the first region 140a has relatively high wettability and the second region 140b has relatively low wettability, a difference in the wettability may selectively define a location where a coating liquid for forming the light emission layer 150 is applied. For example, when the light emission layer 150 is formed by nozzle printing, it may be selectively formed only on the first region 140a on the first electrode 120 while not being formed on the second region 140b adjacent to this portion of the first region 140a. For instance, with nozzle printing, the spray for forming the light emission layer 150 may be somewhat repelled by the second region 140b and somewhat attracted by the first region 140a on the first electrode 120, thus forming the light emission layer 150 directly on this portion of the first region 140a and away from the second region 140b.

As shown in the exemplary embodiment of FIG. 3, a top surface of the light emission layer 150 is lower than the top surface of the first pixel defining layer 130. That is to say, the top surface of the first pixel defining layer 130 may protrude with respect to the light emission layer 150. Among other things, this helps create the lateral surfaces of the first medium layer (corresponding to the second region 140b) and helps form the light emission layer 150 on the first region 140a on the first electrode 120. It also helps protect the light emission layer 150 from being pressed.

The light emission layer 150 may include, for example, a polymeric organic material, a small-molecule organic material, or a combination thereof. In some embodiments, the light emission layer 150 may include a host material and a dopant material. Examples of the host material include tris(8-hydroxy-quinolinato)aluminum (Alq3), 9,10-di(naphth-2-yl) anthracene (AND), 3-Tert-butyl-9,10-di(naphth-2-yl)anthracene (TBADN), 4,4'-Bis(2,2-diphenyl-ethen-1-yl) biphenyl (DPVBi), 4,4'-Bis[2,2-di(4-methylphenyl)-ethen-1-yl]biphenyl(p-DMDPVBi), Tert(9,9-diaryffluorene) (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-Bis[2-(4-tert-butyl-phen-4-yl)-ethen-1-yl]biphenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bisbis(9-phenyl-9H-carbazole) fluorene (FL-4CBP), 4,4'-bis(carbazole-9-yl)-9,9-di-tolyl-fluorene (DPFL-CBP), and 9,9-bis(9-phenyl-9H-carbazole) fluorene (FL-2CBP). Examples of the dopant material include 4,4'-bis[4-(di-p-tolylamino)styryl]biphenyl (DPAVBi), 9,10-di(naph-2-tyl)anthracene (ADN), and 3-tert-butyl-9,10-di(naph-2-tyl)anthracene (TBADN).

As shown in the exemplary embodiment of FIG. 3, the second pixel defining layer 160 is positioned on the first region 140a on the first pixel defining layer 130. The second pixel defining layer 160 thus overlaps the first pixel defining layer 130. In addition, the second pixel defining layer 160 is not positioned on the second region 140b. When the first region 140a has relatively high wettability and the second region 140b has relatively low wettability, a difference in the wettability may selectively define a location where a coating liquid for forming the second pixel defining layer 160 is applied. For example, when the second pixel defining layer 160 is formed by nozzle printing, it may be selectively formed only on the first region 140a on the first pixel defining layer 130 while not being formed on the second region 140b adjacent to this portion of the first region 140a.

In addition, while the second pixel defining layer 160 is related to achieving a particular pixel defining layer thickness, its contribution is less significant, as will be described later. Accordingly, the second pixel defining layer 160 may be less sensitive to patterning accuracy or to film thickness uniformity. Therefore, even if the second pixel defining layer 160 is formed by inkjet printing, display quality may be less affected by the second pixel defining layer 160. As described above, even if the second pixel defining layer 160 is formed by inkjet printing, an ink jet location can be easily and selectively defined by the wettability difference between the first region 140a and the second region 140b, like when the second pixel defining layer 160 is formed by nozzle printing.

The second pixel defining layer 160 may include at least one organic material selected from the group consisting of benzocyclobutene (BCB), polyimide (PI), polyamaide (PA), acryl resin, and phenol resin. In some embodiments, the second pixel defining layer 160 is made of the same material as the first pixel defining layer 130. In other embodiments, however, the second pixel defining layer 160 is made of a different material from the first pixel defining layer 130.

Since the second pixel defining layer 160 is formed on the first pixel defining layer 130, a total thickness of the overall pixel defining layer including the first pixel defining layer 130 and the second pixel defining layer 160 may increase from embodiments where only a single pixel defining layer is used. As described above, the thickness of the first pixel defining layer 130 may be limited (for example, no greater than 1 μm) due to the negative effects on the film thickness uniformity of the first medium layer 140. Since the second pixel defining layer 160 is formed on the first pixel defining layer 130, however, a sufficiently large thickness of the pixel defining layer can be achieved without impairing the film thickness uniformity of the first medium layer 140. For example, a sum of thicknesses of the first pixel defining layer 130 and the second pixel defining layer 160 may be greater than 1 μm.

As described above, if the thickness of the overall pixel defining layer is increased, pixels may no longer be pressed (for example, directly pressed) when an encapsulating substrate is pressed toward the pixels, thereby suppressing dark spots from being caused.

As shown in FIG. 3, the second pixel defining layer 160 is not formed in the opening defined by the first pixel defining layer 130. Accordingly, when the second pixel defining layer 160 is formed after the light emission layer 150, the light emission layer 150 is exposed without being covered by the second pixel defining layer 160. However, in the described method of fabricating the OLED display 100 below, the second pixel defining layer 160 is formed before the light emission layer 150. A second medium layer 170 is formed on the exposed light emission layer 150. The second medium layer 170 helps injection or transport of electrons or holes between the second electrode 180 and the light emission layer 150. When the second electrode 180 is a cathode electrode, the second medium layer 170 is associated with electron injection or transport.

For example, the second medium layer 170 may be formed as a single layer of an electron transport layer or an electron injection layer, or as a stacked layer of an electron transport layer and an electron injection layer. The electron transport layer may include, for example, Alq3. The electron injection layer may include, for example, LiF, NaCl, CsF, Li2O, BaO, Liq, or the like.

As shown in the exemplary embodiment of FIG. 3, the second medium layer 170 extends to a lateral surface of the first pixel defining layer 130, a lateral surface of the second pixel defining layer 160, and a top surface of the second pixel defining layer 160. In other embodiments, the second medium layer 170 may be separated by each pixel. As shown in FIG. 3, the second medium layer 170 is integrally formed over the entire surface of the OLED display 100. Thus, the second medium layer 170 is a common layer and not related with pixel distinction. In some embodiments, the second medium layer 170 may not be provided.

The second electrode 180 is formed on the second pixel defining layer 160 (for example, on the second medium layer 170, as shown in FIG. 3). When the second electrode 180 is used as the cathode electrode, it may be made of a conductive material having a low work function. For example, the second electrode 180 may be made of Ag, Mg, Al, Pt, Pd, Au, Ni, Nd, Ir, Cr, Li, or Ca.

In FIG. 3, an encapsulating substrate 190 is positioned on the second electrode 180. The encapsulating substrate 190 may be an insulating substrate. A spacer may be disposed between the second electrode 180 on the second pixel defining layer 160 and the encapsulating substrate 190. In other embodiments of the present invention, the encapsulating substrate 190 may not be provided. In this case, an encapsulating film made of an insulating material may cover and protect the entire structure.

Hereinafter, a method of fabricating the aforementioned OLED display will be described. FIGS. 4 to 9 are cross-sectional views illustrating process steps of a method of fabricating the OLED display shown in FIGS. 2 and 3.

Figure 4:
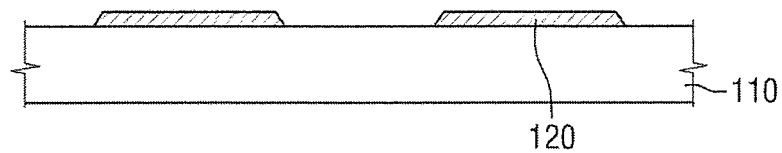
FIGS. 4 to 9 are cross-sectional views illustrating process steps of a method of fabricating the OLED display shown in FIGS. 2 and 3.

Referring first to FIG. 4, the first electrode 120 is formed on the substrate 110. The first electrode 120 may be formed by depositing a conductive material and then patterning the same by a photolithography process. In other embodiments, the first electrode 120 may be formed by printing.

Figure 5:
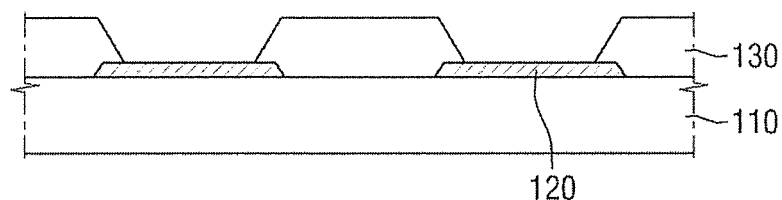

Referring to FIG. 5, the first pixel defining layer 130 having an opening is formed on the substrate 110 having the first electrode 120. The first pixel defining layer 130 may be formed by photolithography or printing, such as nozzle printing or inkjet printing. In order to secure film thickness uniformity of the first medium layer 140 to be deposited later, the first pixel defining layer 130 may be formed to a thickness of about 1 μm or less.

Figure 6:
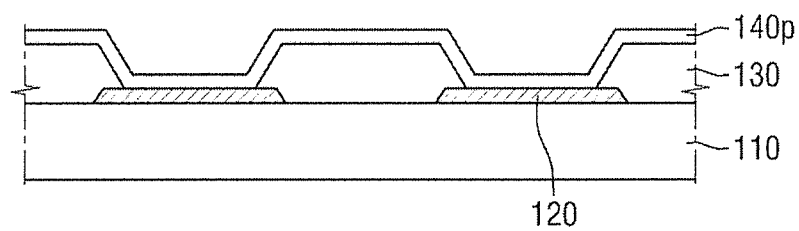

Referring to FIG. 6, a coating film 140p for forming a first medium layer is formed on the entire surface of the structure shown in FIG. 5. The first medium layer forming coating film 140p may be formed by slit coating. When the first medium layer forming coating film 140p is a stacked film of two or more materials, the respective materials are sequentially coated.

Figure 7:
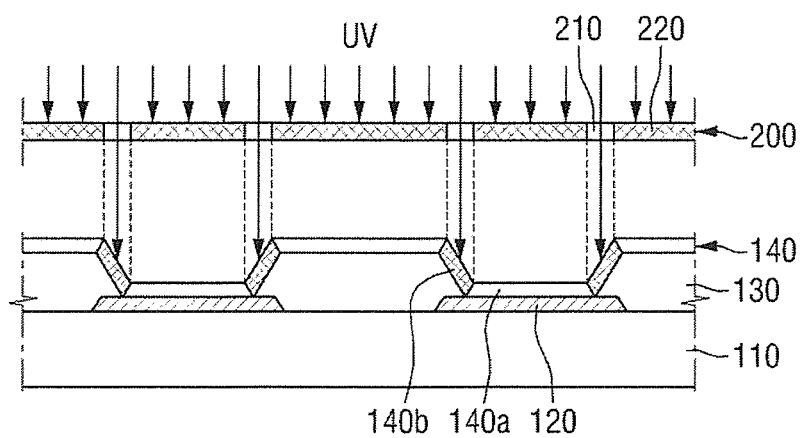

Referring to FIG. 7, the first medium layer forming coating film 140p is selectively subjected to surface treatment. The first medium layer forming coating film 140p will be described as having the same property as the first region 140a (e.g., relatively high wettability) and then a portion of the first medium layer forming coating film 140p is modified to have the same property as the second region 140b (e.g., relatively low wettability) with UV radiation.

An optical mask 200 including a light-transmitting portion 210 and a light-shielding portion 220 is placed on the structure shown in FIG. 6 and UV rays are then radiated. Here, the first medium layer forming coating film 140p disposed on the first electrode 120 and the first medium layer forming coating film 140p disposed on the top surface of the first pixel defining layer 130 correspond to the light-shielding portion 220 while the lateral or tilted surface of the first pixel defining layer 130 corresponds to the light-transmitting portion 210. The UV rays transmitted through the light-transmitting portion 210 of the optical mask 200 then modify a surface of the first medium layer forming coating film 140p. Thus, a region of the first medium layer forming coating film 140p corresponding to the light-shielding portion 220 remains as the first region 140a, while a region of the first medium layer forming coating film 140p corresponding to the light-transmitting portion 210 is modified to the second region 140b. Accordingly, the first medium layer 140 including the first region 140a and the second region 140b is completed.

In some other embodiments of the present invention, the first medium layer forming coating film 140p has the same property as the second region 140b (e.g., relatively low wettability) and is then modified to have the same property as the first region 140a (e.g., relatively high wettability) with UV radiation. In this case, the arrangement of the light-shielding portion 220 and the light-transmitting portion 210 is reversed in the optical mask 200.

Figure 8:
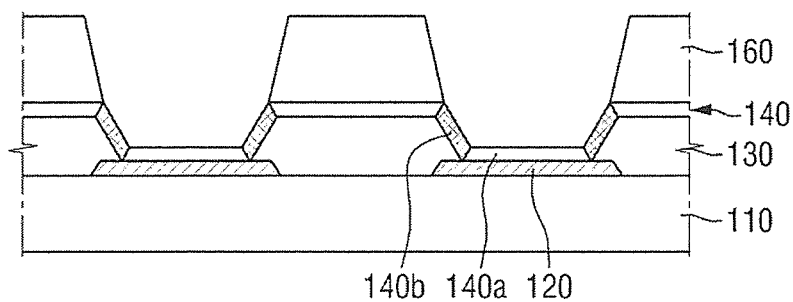

Referring to FIG. 8, the second pixel defining layer 160 is formed on the first region 140a on the first pixel defining layer 130. The second pixel defining layer 160 may be printed, for example, using nozzle printing or inkjet printing. During printing, a coating liquid for forming the second pixel defining layer 160 may be directed toward the second region 140b adjacent to the first region 140a on the first pixel defining layer 130. However, since the second region 140b has low wettability, the coating liquid may move toward the first region 140a on the first pixel defining layer 130. Therefore, a desired pattern of the second pixel defining layer 160 can be accurately implemented.

The second pixel defining layer 160 may also be formed by inkjet printing. Since inkjet printing is advantageous in forming various patterns, it may be selected for forming the second pixel defining layer 160 in place of nozzle printing. During inkjet printing, it is possible to reduce or prevent an unwanted pattern from being formed in the second region 140b due to a wettability difference between the first region 140a and the second region 140b.

Figure 9:
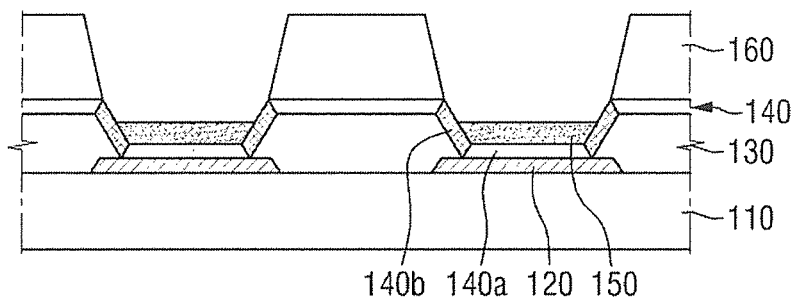

Referring to FIG. 9, the light emission layer 150 is formed by printing an organic light emission material on the first region 140a on the first electrode 120. The printing may be, for example, nozzle printing. During printing, a coating liquid for forming the light emission layer 150 may be partially directed toward the second region 140b adjacent to the first region 140a. However, since the second region 140b has low wettability, this portion of the coating liquid may move toward the first region 140a on the first electrode 120. In addition, since the first pixel defining layer 130 and the second pixel defining layer 160 may be used as printing barriers, patterning accuracy of the light emission layer 150 can be improved.

Referring back to FIG. 3, the second medium layer 170 is formed by depositing a material for forming the second medium layer 170 using an open mask. The second electrode 180 is formed by depositing a conductive film on the second medium layer 170. The encapsulating substrate 190 is disposed on the second electrode 180 (for example, with a spacer on the second electrode 180 on the second pixel defining layer 160 to separate the encapsulating substrate 190 from the second electrode 180), thereby completing the OLED display 100 shown in FIG. 3.

Hereinafter, another embodiment of the present invention will be described. In the following embodiment, the same components as those of the previous embodiment will not be described or may only briefly be described.

Figure 10:
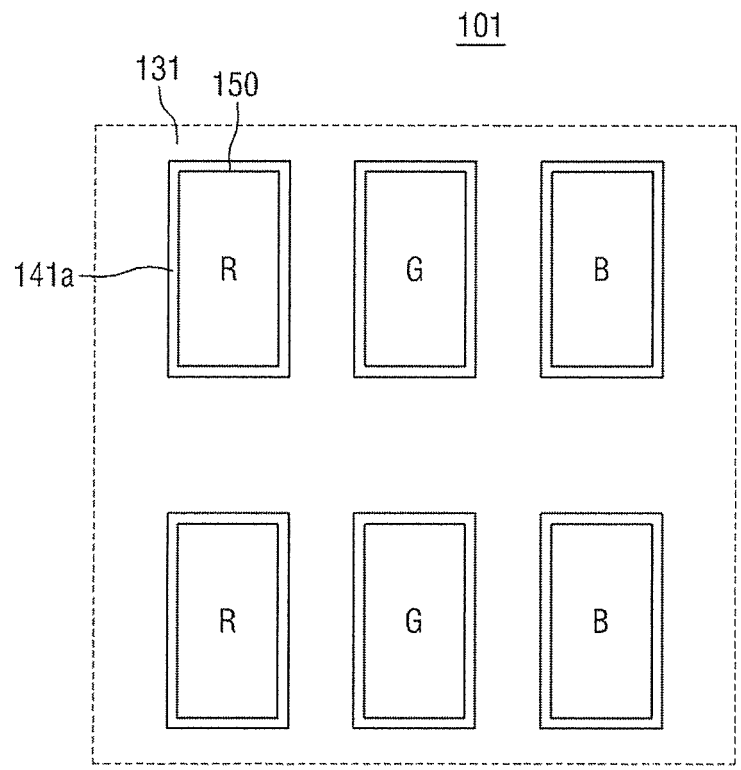
FIG. 10 is a layout view of an OLED display according to another embodiment of the present invention.
Figure 11:
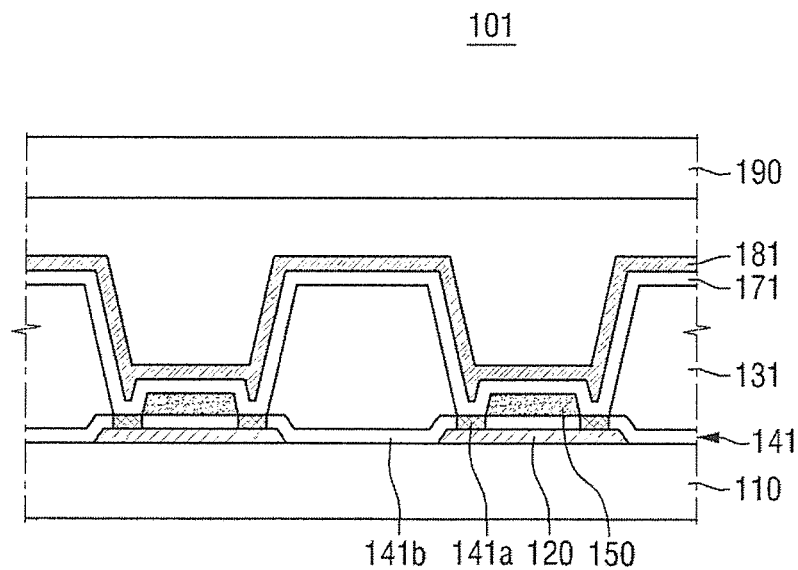
FIG. 11 is a cross-sectional view of the OLED display shown in FIG. 10.

FIG. 10 is a layout view of an OLED display 101 according to another embodiment of the present invention. FIG. 11 is a cross-sectional view of the OLED display 101 shown in FIG. 10.

Referring to FIGS. 10 and 11, the OLED display 101 is different from the OLED display 100 shown in FIGS. 2 and 3 in that a pixel defining layer 131 is formed of a single layer without being separated into two layers and is formed on a first medium layer 141. The first medium layer 141 includes a first region 141b and a second region 141a, with the first region 141b corresponding to the pixel defining layer 131 and a light emission layer 150 having corresponding portions on the substrate 110 and the first electrode 120.

In more detail, the first medium layer 141 is formed on (for example, directly formed on) a substrate 110 having a first electrode 120 without a pixel defining layer interposed between the first medium layer 141 and the substrate 110. Like in the embodiment shown in FIG. 3, the first medium layer 141 includes the first region 141b and the second region 141a. However, unlike in the embodiment shown in FIG. 3, the first region 141b is positioned on the first electrode 120 (in a region where a bottom surface of the light emission layer 150 is positioned) and on the substrate 110 (in a region where a bottom surface of the pixel defining layer 131 is positioned) Further, the second region 141a is positioned in a space on the first electrode 120 and between the light emission layer 150 and the pixel defining layer 131. In the embodiment shown in FIG. 3, the first medium layer 140 does not overlap the second pixel defining layer 160 but does overlap the first pixel defining layer 130. However, in the present embodiment of FIG. 11, the first medium layer 141 does not overlap the pixel defining layer 131.

The light emission layer 150 is positioned on the first region 141b on the first electrode 120, and the pixel defining layer 131 is positioned on the first region 141b on the substrate 110. In the illustrated embodiment of FIG. 11, the second region 141a is positioned in part on the first electrode 120, but aspects of the present invention are not limited thereto. A second medium layer 171 and a second electrode 181 are sequentially formed on the light emission layer 150 and the pixel defining layer 131.

In the present embodiment of FIG. 11, since the first medium layer 141 is not formed on the pixel defining layer 131 but is instead formed on (for example, directly formed on) the substrate 110 having the first electrode 120, a thickness of the pixel defining layer 131 does not affect film thickness uniformity of the first medium layer 141. Rather, since the pixel defining layer 131 is not provided between the first medium layer 141 and the substrate 110, planarity of the underlying structure is improved, thereby improving film thickness uniformity of the first medium layer 141.

Further, a thickness of the pixel defining layer 131 may be adjusted to have a sufficiently large thickness without having to adjust the thickness to 1 μm or less. For example, the thickness of the pixel defining layer 131 may be greater than 1 μm. Therefore, when an encapsulating substrate is pressed toward pixels, the pixels may avoid being pressed (for example, directly pressed), thereby suppressing dark spots from being caused to the pixels.

Hereinafter, a method of fabricating the OLED display 101 will be described. FIGS. 12 to 15 are cross-sectional views illustrating process steps of a method of fabricating the OLED display 101 shown in FIGS. 10 and 11.

In the present embodiment, process steps up to the step of forming the first electrode 120 on the substrate 110 are the same as those of the embodiment shown in FIG. 4. Next, referring to FIG. 12, a coating film 141p for forming a first medium layer 141 is formed. The first medium layer forming coating film 141p may be formed by slit coating. When the first medium layer forming coating film 141p is a stacked film of two or more materials, the respective materials are sequentially coated.

Figure 13:
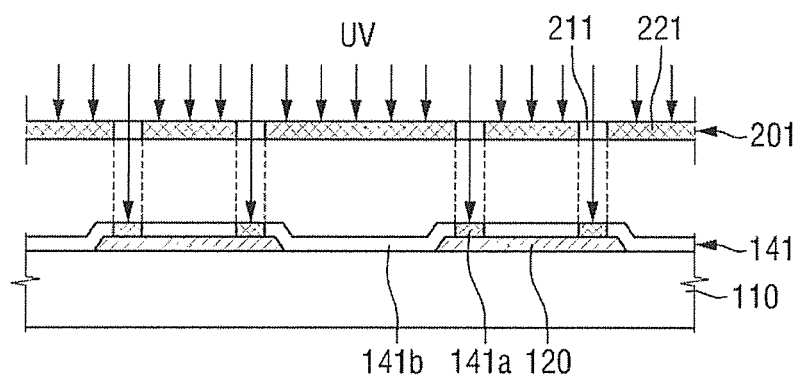

Next, referring to FIG. 13, the first medium layer forming coating film 141p is selectively subjected to surface treatment. The first medium layer forming coating film 141p will be described as having the same property as the first region 141b (e.g., relatively high wettability) and is then modified to have the same property as the second region 141a (e.g., relatively low wettability) with UV radiation.

Figure 12:
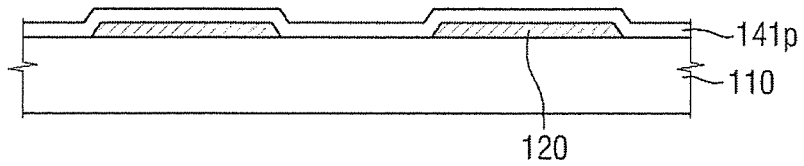
FIGS. 12 to 15 are cross-sectional views illustrating process steps of a method of fabricating the OLED display shown in FIGS. 10 and 11.

An optical mask 201 including a light-transmitting portion 211 and a light-shielding portion 221 is placed on the structure shown in FIG. 12 and UV rays are then radiated. Here, the light-shielding portion 221 is placed to correspond to locations of a first electrode 120 and a pixel defining layer 131, while the light-transmitting portion 211 is placed to correspond to spaces between the first electrode 120 and the pixel defining layer 131. The UV rays transmitted through the light-transmitting portion 211 of the optical mask 201 then modify a surface of the first medium layer forming coating film 141p. Thus, a region of the first medium layer forming coating film 141p corresponding to the light-shielding portion 221 remains as the first region 141b, while a region of the first medium layer forming coating film 141p corresponding to the light-transmitting portion 211 is modified to the second region 141a. Accordingly, the first medium layer 141 including the first region 141b and the second region 141a is completed.

In some other embodiments of the present invention, the first medium layer forming coating film 141p has the same property as the second region 141a (e.g., relatively low wettability) and is then modified to have the same property as the first region 141b (e.g., relatively high wettability) with UV radiation. In this case, the arrangement of the light-shielding portion 221 and the light-transmitting portion 211 is reversed in the optical mask 201.

Figure 14:
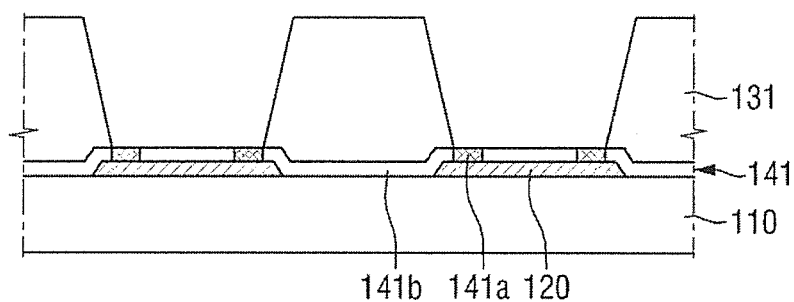

Referring to FIG. 14, the pixel defining layer 131 is formed on the first region 141b on the substrate 110. The pixel defining layer 131 may be printed, for example, using nozzle printing or inkjet printing.

Figure 15:
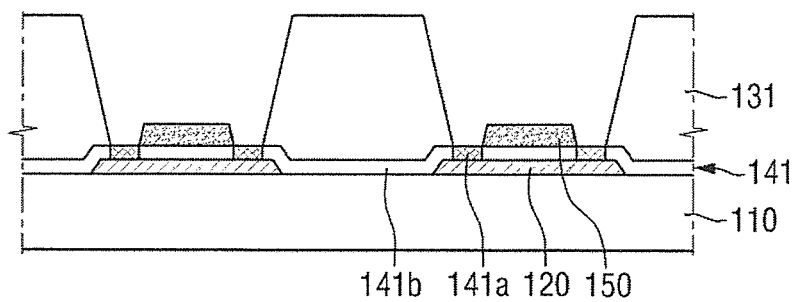

Referring to FIG. 15, the light emission layer 150 is formed by printing an organic light emission material on the first region 141b on the first electrode 120. Here, the pixel defining layer 131 may be used as a printing barrier. Next, referring to FIG. 11, a second medium layer 171 and a second electrode 181 are formed and an encapsulating substrate 190 is then positioned, thereby completing the OLED display 101 shown in FIG. 11.

While the present invention has been particularly shown and described with reference to exemplary embodiments thereof, it will be understood by those of ordinary skill in the art that various changes in form and details may be made therein without departing from the spirit and scope of the invention as defined by the following claims, and their equivalents. The above embodiments should be considered in all respects as illustrative and not restrictive, reference being made to the appended claims and their equivalents, rather than the foregoing description, to indicate the scope of the present invention.

What is claimed is:

1. An organic light emitting diode (OLED) display comprising:
   a substrate;
   a first electrode on the substrate;
   a first pixel defining layer on the substrate and exposing at least a portion of the first electrode;
   a medium layer on the first pixel defining layer and the first electrode, the medium layer comprising a first region and a second region, the first region comprising a first portion on the first electrode and a second portion on the first pixel defining layer;
   a second pixel defining layer overlapping the first pixel defining layer with the second portion of the first region of the medium layer therebetween;
   a light emission layer overlapping the first electrode with the first portion of the first region of the medium layer therebetween; and
   a second electrode covering the second pixel defining layer and the light emission layer.

2. The OLED display of claim 1, wherein
   the second region is formed by surface modification of the first region, or
   the first region is formed by surface modification of the second region.

3. The OLED display of claim 1, wherein the second region has lower wettability than the first region.

4. The OLED display of claim 1, wherein the second region overlaps the first pixel defining layer while not overlapping the second pixel defining layer.

5. The OLED display of claim 1, wherein
the first pixel defining layer has a first thickness of 1 μm or less, and
a sum of the first thickness and a thickness of the second pixel defining layer is greater than 1 μm.

6. The OLED display of claim 1, wherein the medium layer is a common layer for pixels of the OLED display.

7. An organic light emitting diode (OLED) display comprising:
a substrate supporting a plurality of pixels;
a first electrode in each of the pixels;
a medium layer on the substrate and the first electrode, the medium layer comprising a first region and a second region, the first region comprising a first portion on the first electrode and a second portion on the substrate;
a pixel defining layer at boundary portions of the pixels and above the second portion of the first region of the medium layer, the pixel defining layer not overlapping the second region of the medium layer;
a light emission layer overlapping the first electrode and on the first portion of the first region of the medium layer, the light emission layer not overlapping the second region; and
a second electrode covering the pixel defining layer and the light emission layer.

8. An organic light emitting diode (OLED) display comprising:
a substrate supporting a plurality of pixels;
a first electrode in each of the pixels;
a medium layer on the substrate and the first electrode, the medium layer comprising a first region and a second region, the first region comprising a first portion on the first electrode and a second portion on the substrate;
a pixel defining layer at boundary portions of the pixels and above the second portion of the first region of the medium layer;
a light emission layer overlapping the first electrode and on the first portion of the first region of the medium layer; and
a second electrode covering the pixel defining layer and the light emission layer,
wherein
the second region is formed by surface modification of the first region, or
the first region is formed by surface modification of the second region.

9. An organic light emitting diode (OLED) display comprising:
a substrate supporting a plurality of pixels;
a first electrode in each of the pixels;
a medium layer on the substrate and the first electrode, the medium layer comprising a first region and a second region, the first region comprising a first portion on the first electrode and a second portion on the substrate;
a pixel defining layer at boundary portions of the pixels and above the second portion of the first region of the medium layer;
a light emission layer overlapping the first electrode and on the first portion of the first region of the medium layer; and
a second electrode covering the pixel defining layer and the light emission layer,
wherein the second region has lower wettability than the first region.

10. The OLED display of claim 7, wherein the second region does not overlap the pixel defining layer.

11. The OLED display of claim 7, wherein the medium layer is a common layer of the pixels.

12. A method of fabricating an organic light emitting diode (OLED) display, the method comprising:
forming a first electrode on a substrate;
forming a first pixel defining layer on the substrate while exposing at least a portion of the first electrode;
forming a medium layer on the first pixel defining layer and the first electrode, the medium layer comprising a first region and a second region, the first region comprising a first portion on the first electrode and a second portion on the first pixel defining layer;
forming a second pixel defining layer overlapping the first pixel defining layer with the second portion of the first region of the medium layer therebetween;
forming a light emission layer overlapping the first electrode with the first portion of the first region of the medium layer therebetween; and
forming a second electrode covering the second pixel defining layer and the light emission layer.

13. The method of claim 12, wherein the forming of the medium layer comprises
forming the second region by selective surface modification of the first region, or
forming the first region by selective surface modification of the second region.

14. The method of claim 13, wherein the selective surface modification comprises selective UV radiation.

15. The method of claim 12, wherein the forming of the second pixel defining layer comprises nozzle printing or ink-jet printing.

16. The method of claim 12, wherein
the first pixel defining layer has a first thickness of 1 μm or less, and
a sum of the first thickness and a thickness of the second pixel defining layer is greater than 1 μm.

17. A method of fabricating an organic light emitting diode (OLED) display comprising pixels, the method comprising:
forming a first electrode on a substrate;
forming a medium layer on the substrate and the first electrode, the medium layer comprising a first region and a second region, the first region comprising a first portion on the first electrode and a second portion on the substrate;
forming a pixel defining layer at boundary portions of the pixels and above the second portion of the first region of the medium layer, the pixel defining layer overlapping the first region and not overlapping the second region;
forming a light emission layer overlapping the first electrode, the light emission layer overlapping the first portion of the first region and not overlapping the second region; and
forming a second electrode covering the pixel defining layer and the light emission layer.

18. A method of fabricating an organic light emitting diode (OLED) display comprising pixels, the method comprising:
forming a first electrode on a substrate;
forming a medium layer on the substrate and the first electrode, the medium layer comprising a first region and a second region, the first region comprising a first portion on the first electrode and a second portion on the substrate;
forming a pixel defining layer at boundary portions of the pixels and above the second portion of the first region of the medium layer;

forming a light emission layer overlapping the first electrode and on the first portion of the first region of the medium layer; and forming a second electrode covering the pixel defining layer and the light emission layer, wherein the forming of the medium layer comprises forming the second region by selective surface modification of the first region, or forming the first region by selective surface modification of the second region.

19. The method of claim 18, wherein the selective surface modification comprises selective UV radiation.

20. A method of fabricating an organic light emitting diode (OLED) display comprising pixels, the method comprising:

forming a first electrode on a substrate;

forming a medium layer on the substrate and the first electrode, the medium layer comprising a first region and a second region, the first region comprising a first portion on the first electrode and a second portion on the substrate;

forming a pixel defining layer at boundary portions of the pixels and above the second portion of the first region of the medium layer;

forming a light emission layer overlapping the first electrode and on the first portion of the first region of the medium layer; and forming a second electrode covering the pixel defining layer and the light emission layer, wherein the forming of the pixel defining layer comprises nozzle printing or inkjet printing.

21. The OLED display of claim 7, wherein the light emission layer is not in contact with the pixel defining layer.

22. The method of claim 17, wherein the light emission layer is not in contact with the pixel defining layer.

* * * * *